(12) United States Patent
Hsu et al.

(10) Patent No.: US 7,947,591 B2
(45) Date of Patent: May 24, 2011

(54) SEMICONDUCTOR DEVICES WITH DUAL-METAL GATE STRUCTURES AND FABRICATION METHODS THEREOF

(75) Inventors: Peng-Fu Hsu, Hsinchu (TW); Fong-Yu Yen, Taoyuan County (TW); Yi-Shien Mor, Hsinchu (TW); Huan-Just Lin, Hsinchu (TW); Ying Jin, Singapore (SG); Hun-Jan Tao, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 592 days.

(21) Appl. No.: 12/099,827

(22) Filed: Apr. 9, 2008

(65) Prior Publication Data

US 2008/0188044 A1  Aug. 7, 2008

Related U.S. Application Data

(62) Division of application No. 11/552,704, filed on Oct. 25, 2006, now Pat. No. 7,378,713.

(51) Int. Cl.
*H01L 21/3205* (2006.01)

(52) U.S. Cl. ................... 438/591; 438/216; 438/287

(58) Field of Classification Search .................. None
See application file for complete search history.

(56) References Cited

U.S. PATENT DOCUMENTS

| 6,089,695 | A | 7/2000 | Takagi et al. |
| 6,323,115 | B1 | 11/2001 | Tanabe et al. |
| 6,821,521 | B1 | 11/2004 | Robinson et al. |
| 6,831,310 | B1 | 12/2004 | Mathew et al. |
| 6,855,641 | B2 | 2/2005 | Ryu et al. |
| 2003/0057499 | A1 | 3/2003 | Yamamoto |
| 2003/0128384 | A1 | 7/2003 | Nelson et al. |
| 2004/0066535 | A1 | 4/2004 | Oyumi |
| 2004/0245578 | A1 | 12/2004 | Park et al. |
| 2005/0157138 | A1 | 7/2005 | Silverbrook et al. |
| 2006/0166424 | A1 * | 7/2006 | Schaeffer et al. ............. 438/199 |
| 2007/0075351 | A1 | 4/2007 | Schulz et al. |

OTHER PUBLICATIONS

TW office action mailed Feb. 24, 2010.

* cited by examiner

*Primary Examiner* — Zandra Smith
*Assistant Examiner* — Pamela E Perkins
(74) *Attorney, Agent, or Firm* — Thomas|Kayden

(57) ABSTRACT

Semiconductor devices with dual-metal gate structures and fabrication methods thereof. A semiconductor substrate with a first doped region and a second doped region separated by an insulation layer is provided. A first metal gate stack is formed on the first doped region, and a second metal gate stack is formed on the second doped region. A sealing layer is disposed on sidewalls of the first gate stack and the second gate stack. The first metal gate stack comprises an interfacial layer, a high-k dielectric layer on the interfacial layer, a first metal layer on the high-k dielectric layer, a metal insertion layer on the first metal layer, a second metal layer on the metal insertion layer, and a polysilicon layer on the second metal layer. The second metal gate stack comprises an interfacial layer, a high-k dielectric layer on the interfacial layer, a second metal layer on the high-k dielectric layer, and a polysilicon layer on the second metal layer.

16 Claims, 8 Drawing Sheets

US 7,947,591 B2

SEMICONDUCTOR DEVICES WITH DUAL-METAL GATE STRUCTURES AND FABRICATION METHODS THEREOF

CROSS REFERENCE TO RELATED APPLICATIONS

This application is a Divisional of pending U.S. patent application Ser. No. 11/552,704, filed Oct. 25, 2006 and entitled "SEMICONDUCTOR DEVICES WITH DUAL-METAL GATE STRUCTURES AND FABRICATION METHODS THEREOF".

BACKGROUND OF THE INVENTION

1. Field of the Invention

The invention relates to semiconductor devices, and more particularly to complementary metal oxide semiconductor (CMOS) devices with dual-metal gate structures and fabrication methods thereof.

2. Description of the Related Art

Conventional complementary metal oxide semiconductor devices are manufactured with polysilicon gate structure. Polysilicon, however, is susceptible to a depletion effect, which can add to the overall gate dielectric thickness in CMOS devices. Scaled CMOS devices require metal gates which eliminate polysilicon depletion effects due to their allowance for excellent current flow and less voltage depletion problems. When a metal gate is inverted, there is no substantial depletion of carriers at the interface between the metal gate and gate dielectric. Accordingly, transistor performance does deteriorate because the electrical thickness of the gate stack is decreased. The integration of semiconductor transistors having dual work function metal gates, however, is troublesome. For example, it is difficult to manipulate the work function of metals.

Dual work function gates are advantageously used in semiconductor devices having both PMOS and NMOS transistors. Some work functions that enable optimal operation of both PMOS and NMOS transistors are required. The optimal work function for a metal gate electrode will differ depending upon whether it is used to form an NMOS transistor or a PMOS transistor. For this reason, when the same material is used to make metal gate electrodes for NMOS and PMOS transistors, the gate electrodes do not demonstrate the desired work function for both types of devices. It may be possible to address this problem by separately forming metal gate electrode of the NMOS transistor from a first material and metal gate electrode of the PMOS transistor from a second material. The first material may ensure an acceptable work function for the NMOS gate electrode, while the second material may ensure an acceptable work function for the PMOS gate electrode. Processes for forming such dual metal gate devices may, however, be complex and expensive.

FIG. 1 is a cross section of a conventional CMOS transistor incorporating dual metal gate structures thereon. The CMOS transistor includes a PMOS transistor 10P that is typically formed in an n-well (not shown) and an NMOS transistor 10N that is formed in a p-well (not shown). The substrate 1 has a first well of the first conductivity type and a second well of the second conductivity type. The first well and the second well are isolated from one another by shallow trench isolation (STI) 13 in the substrate to separate PMOS transistor 10P from NMOS transistor 10N. Gate dielectric 15 is deposited on the surface of the semiconductor substrate 1 over both the PMOS transistor 10P and the NMOS transistor 10N. As suggested above, CMOS transistor also incorporates a dual-metal gate conductor in the form of first metal gate conductor 16a and second metal gate conductor 16b. First metal gate conductor 16a is deposited and formed on gate dielectric 15 over PMOS region 10P. Second metal gate conductor 16b is separately deposited and formed on gate dielectric 16b over NMOS region 10N. Polysilicon electrode 17 is deposited and formed on the first and second metal gate conductors 16a and 16b. Processes for forming such dual metal gate devices may, however, be complex and expensive.

Methods for fabricating a semiconductor device having a metal gate electrode are also disclosed in, for example, U.S. Pat. No. 6,974,764, the entirety of which is hereby incorporated by reference. That method comprises forming a dielectric layer on a substrate, and forming a first metal layer on a first part of the dielectric layer, leaving a second part of the dielectric layer exposed. After a second metal layer is formed on both the first metal layer and the second part of the dielectric layer, a masking layer is formed on the second metal layer.

BRIEF SUMMARY OF THE INVENTION

Accordingly, the invention is directed to complementary metal oxide semiconductor (CMOS) devices with dual-metal gate structures. A first metal gate stack and a second metal gate stack are formed on a first and a second doped regions of a semiconductor substrate. The first metal gate stack is a tri-layer metal structure comprising a first metal layer, a metal insertion layer, and a second metal layer. The insertion layer serves as protection and modulates the work function of the first metal layer. A sealing layer is disposed on sidewalls of the first gate stack and the second gate stack preventing oxidization of the gate stacks.

The invention provides complementary metal oxide semiconductor (CMOS) devices with dual-metal gate structures. A semiconductor substrate with a first doped region and a second doped region separated by insulation is provided. A first metal gate stack is formed on the first doped region, and a second metal gate stack is formed on the second doped region. A sealing layer is disposed on sidewalls of the first gate stack and the second gate stack. The first metal gate stack comprises an interfacial layer, a high-k dielectric layer on the interfacial layer, a first metal layer on the high-k dielectric layer, a metal insertion layer on the first metal layer, a second metal layer on the metal insertion layer, and a polysilicon layer on the second metal layer. The second metal gate stack comprises an interfacial layer, a high-k dielectric layer on the interfacial layer, a second metal layer on the high-k dielectric layer, and a polysilicon layer on the second metal layer.

The invention further provides method for fabricating a CMOS device with dual-metal gate structures, comprising providing a semiconductor substrate with a first doped region and a second doped region separated by an insulation layer, forming an interfacial layer on the semiconductor substrate, forming a high-k dielectric layer on the interfacial layer, forming a first metal layer on the high-k dielectric layer, forming a metal insertion layer on the first metal layer, patterning the metal insertion layer, the first metal layer, the high-k dielectric layer, and the interfacial layer exposing the second doped region of the semiconductor substrate, conformably forming a second metal layer on the metal insertion layer and the second doped region of the semiconductor substrate, forming a polysilicon layer on the second metal layer, patterning a first metal gate stack and a second metal gate stack on the first and the second doped regions of the semiconductor substrate, forming a sealing layer on sidewalls of the first gate stack and the second gate stack.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
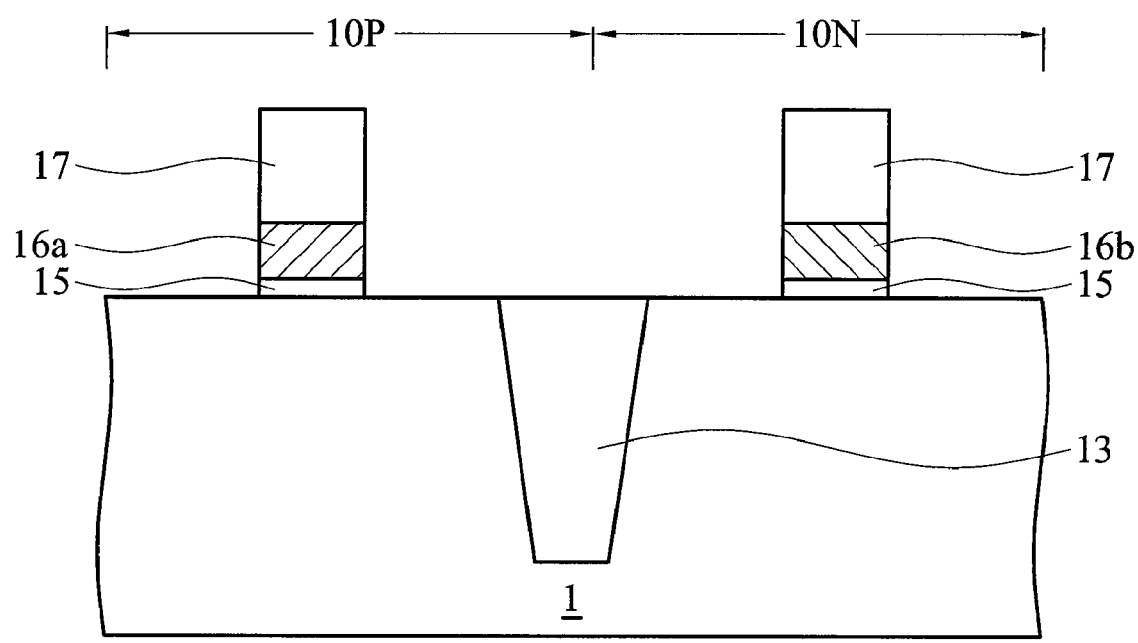
FIG. 1 is a cross section of a conventional CMOS transistor incorporating dual metal gate structures thereon.
Figure 2A:
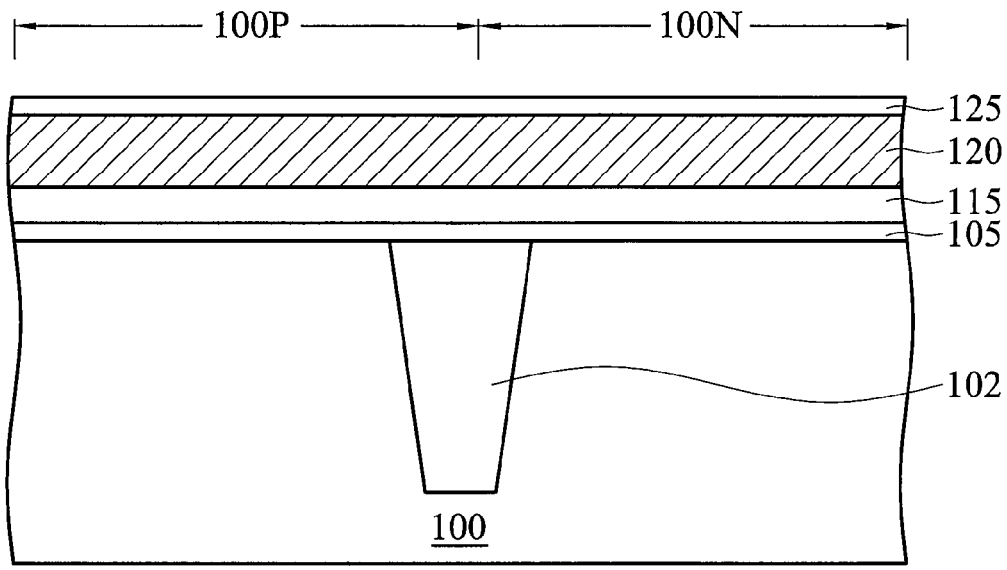
FIGS. 2A-2I are cross sections of the steps of fabricating a semiconductor device with dual metal gate structures according to embodiment of the invention.

The process of forming the transistor structure described above is depicted in FIGS. 2A-2I. In FIG. 2A, a gate dielectric layer 115 on a substrate 100 by conventional methods. Substrate 100 may comprise a bulk silicon or silicon-on-insulator (SOI) substructure. The substrate 100 includes a monocrystalline silicon substrate doped to p-well for an NMOS device 110N or to an n-well for a PMOS device 110P. An interfacial layer 105 comprising a substantial amount of Si, O, and N is formed on the surface after RCA cleaning. The interfacial layer can alternatively be formed by thermal or chemical oxidation. The interfacial layer may alternatively comprise $SiO_2$ and $SiO_xN_y$ with a nitrogen atomic ratio ranging from 1 to 15% having a thickness of 0-3 nm.

Dielectric layer 115 preferably comprises a high-k gate dielectric layer. Some of the materials that may be used to make high-k gate dielectrics include a substantial amount of nitrogen such as single or multi-metal oxides or silicates comprising Hf, Al, Zr, La, or other metal elements. The thickness of the dielectric layer 115 is preferably 1-10 nm and comprises a silicon atomic ratio ranging from 10 to 90%. The high-k dielectric layer 115 may alternatively comprise $HfO_2$ or $HfSiO_x$.

Dielectric layer 115 may be formed on substrate 100 using a conventional deposition method, e.g., atomic layered deposition (ALD), chemical vapor deposition (CVD), or physical vapor deposition (PVD). The silicon atomic ratio and dielectric constant of the high-k dielectric layer 115 can be adjusted during ALD, CVD, and PVD processes. The high-k dielectric layer 115 such as $HfSiO_x$ with 30-80% silicon atomic ratio and 7-20 dielectric constant can be formed by adjusting an Hf and a Si precursor cycle numbers during a nano-laminated ALD.

Moreover, the high-k dielectric layer 115 can be a nitrified high-k dielectric layer comprising a nitrogen atomic ratio ranging from 5 to 30% and a thickness ranging from 1 to 10 nm. The nitrified high-k dielectric layer can be $HfSiO_xN_y$ with a silicon atomic ratio ranging from 10 to 90%. The high-k dielectric layer 115 can alternatively be amorphous. A nitrification process is preferably performed during or after the formation of the high-k dielectric layer. The high-k dielectric layer is nitrified by thermal or plasma nitrification.

After dielectric layer 115 is formed on substrate 100, a first metal layer 120 is formed on dielectric layer 115. A metal insertion layer 125 is sequentially formed on the first metal layer 120. The first metal layer 120 comprising metal, metal alloy, metal carbide, metal nitride, or conductive metal oxide is preferably formed by ALD or PVD. The metal insertion layer 125 comprises metal, metal alloy, metal carbide, metal nitride, or conductive metal oxide, having a thickness ranging from 1 to 10 nm. The metal insertion layer 125 preferably consists of $TaC_x$, $TaN_x$, or $TiN_x$ formed in a separate chamber sharing the same transfer chamber as metal gate formation tool without breaking the vacuum. The metal insertion layer 125 is used to protect the first metal layer 120 from a patterning process and serves as work function modulation for the first metal layer 120.

Figure 2B:
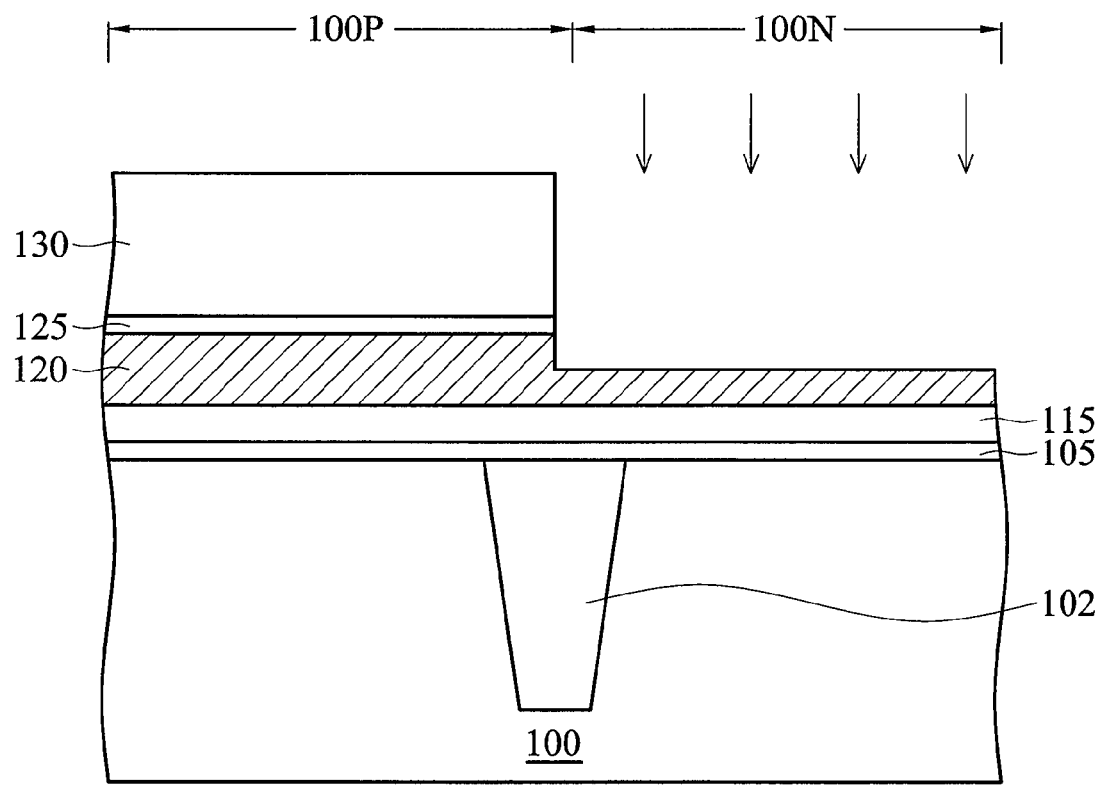
Figure 2C:
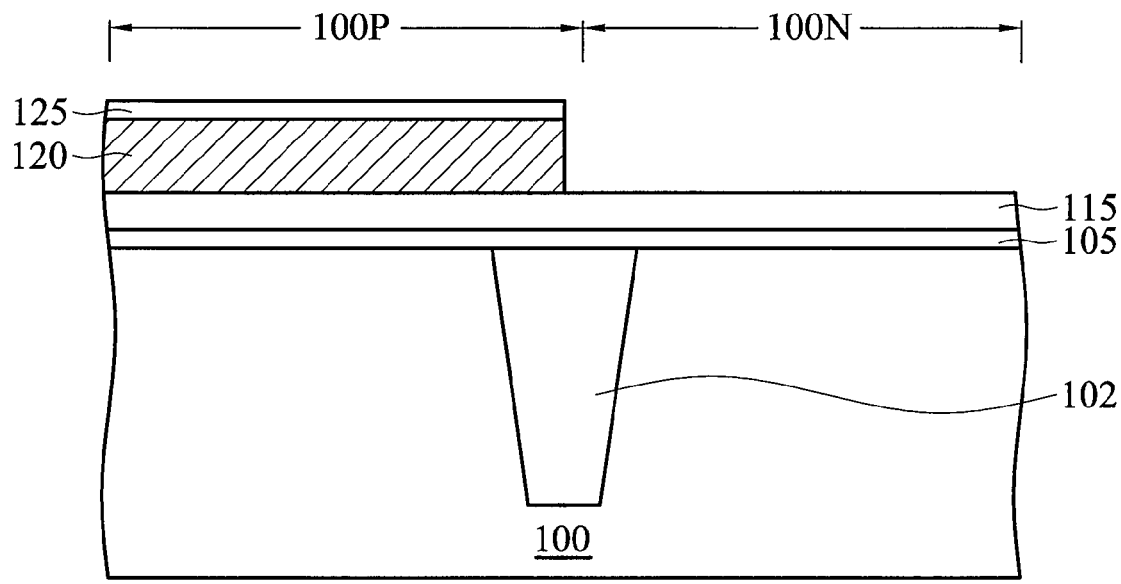

Referring to FIG. 2B, part of metal insertion layer 125 is then masked by masking layer 130. The metal insertion layer 125 and the first metal layer 120 are sequentially removed, leaving part of dielectric layer 115 exposed, generating the FIG. 2C structure. The metal insertion layer 125 and the first metal layer 120 are preferably removed by a dry, wet, or dry and wet etching process 210. A plasma dry etching process, e.g., one using a chlorine based plasma, may be applied to remove the metal insertion layer 125 and the first metal layer 120 selective to dielectric layer 115. After the metal insertion layer 125 and the first metal layer 120 are etched, the remainder of masking layer 130 is striped.

Figure 2D:
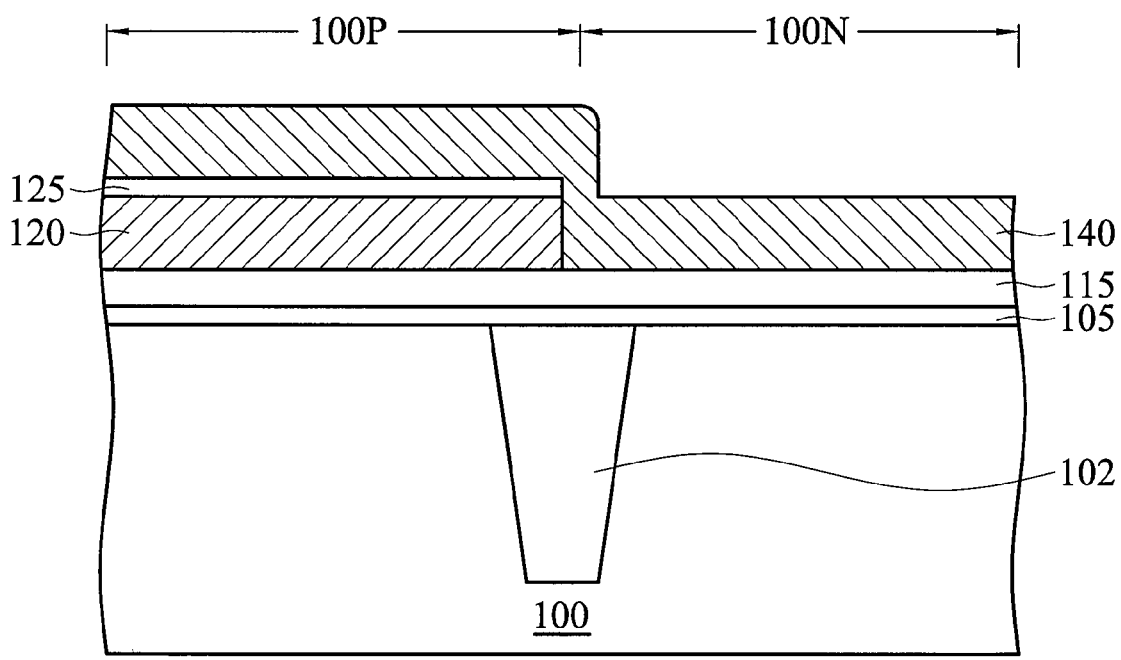

Referring to FIG. 2D, a second metal layer 140 is conformably deposited on metal insertion layer 125 and on the exposed portion of dielectric layer 115. The first metal layer 120 and the second metal layer 140 are selected from different materials, i.e., when the first metal layer 120 comprises an n-type metal, the second metal layer 140 preferably comprises a p-type metal. Both the first metal layer and the second metal layer comprise $TaC_x$, $TaN_x$, $TiN_x$, Ru, $RuO_2$, $MoN_x$, $MoO_xN_y$, or WN, having a thickness ranging from 1 to 30 nm. Note that the metal insertion layer 125 and the second metal layer 140 are selected from the same material.

Figure 2E:
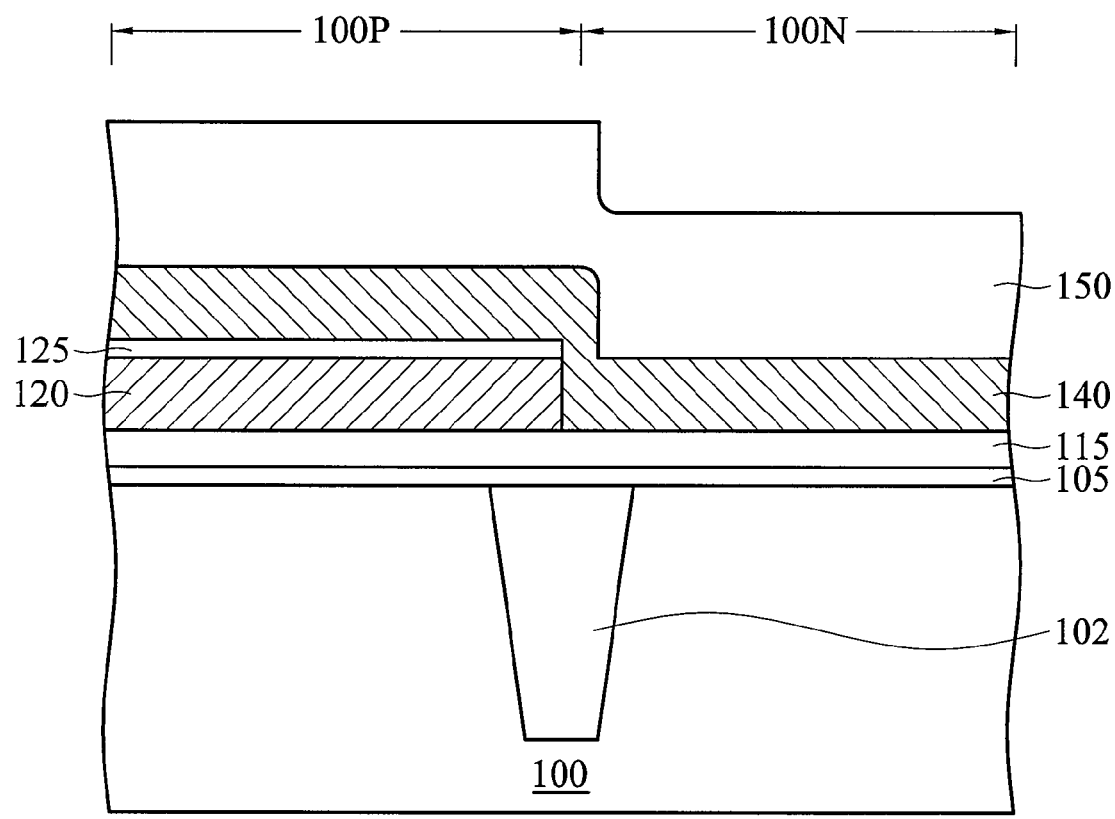

Referring to FIG. 2E, after depositing the second metal layer 140 on the metal insertion layer 125 and dielectric layer 115, a polysilicon layer 150 is deposited on the second metal layer 140. The polysilicon layer 150 is preferably formed by chemical vapor deposition, having a thickness ranging from 30 to 200 nm. The gate patterning process or the film scheme used is well known in the art, and such would not be necessary to be disclosed here.

Figure 2F:
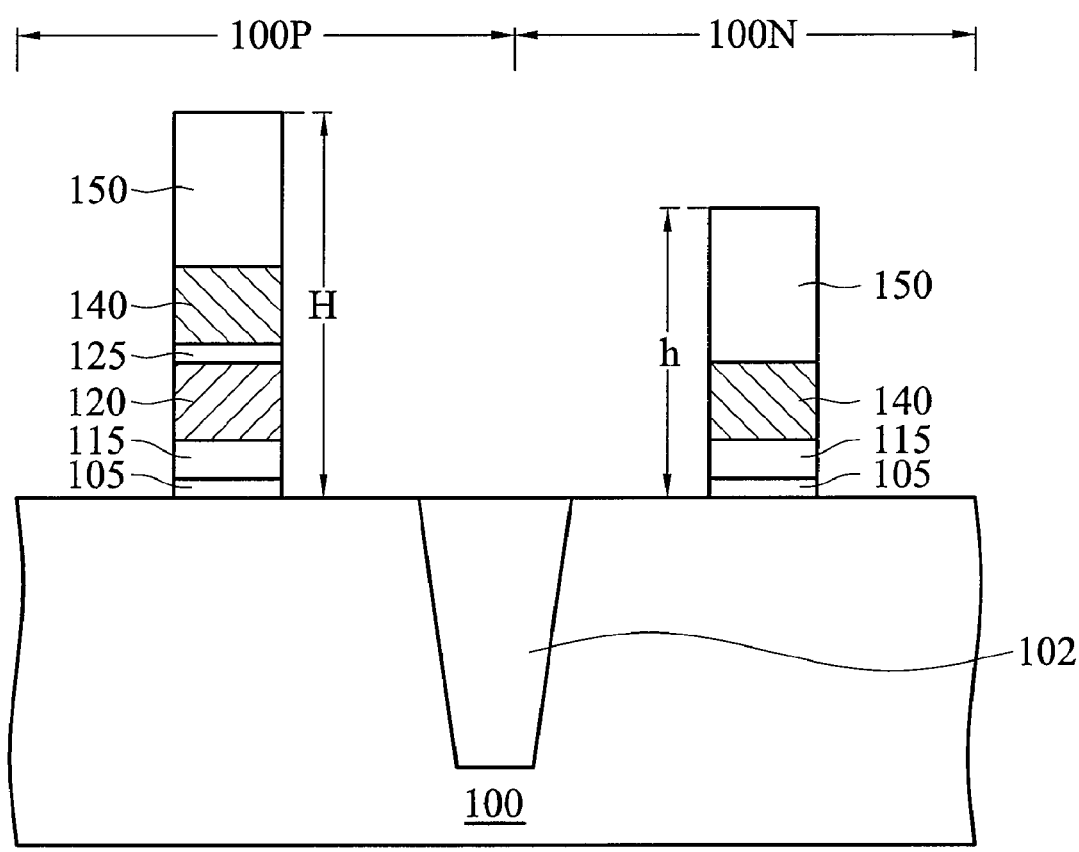

After photo processing, a dry etching process may be used to create a first gate stack and the second stack, generating the structure shown in FIG. 2F. The first metal gate stack comprises an interfacial layer 105, a high-k dielectric layer 115 on the interfacial layer 105, a first metal layer 120 on the high-k dielectric layer 115, a metal insertion layer 125 on the first metal layer 120, a second metal layer 140 on the metal insertion layer 125, and a polysilicon layer 150 on the second metal layer 140. The second metal gate stack comprises an interfacial layer 105, a high-k dielectric layer 115 on the interfacial layer 105, a second metal layer 140 on the high-k dielectric layer 115, and a polysilicon layer 150 on the second metal layer 140. Portions of the semiconductor device are completed by fabricating a first transistor 300P of the first conductive type and a second transistor 300N of the second conductive type. Note that the height difference between the first and the second gate stacks is equal to or greater than the total of thickness of the metal insertion layer 125 and the first metal layer 120.

Figure 2G:
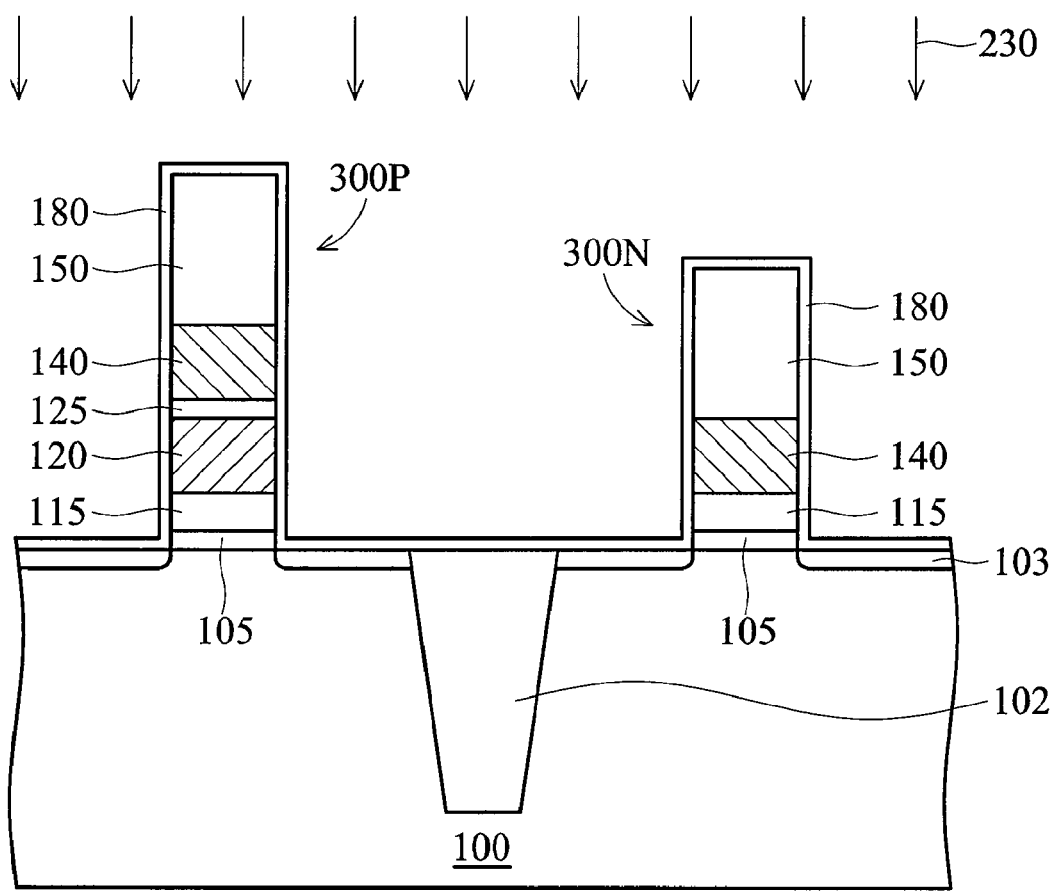
Figure 2H:
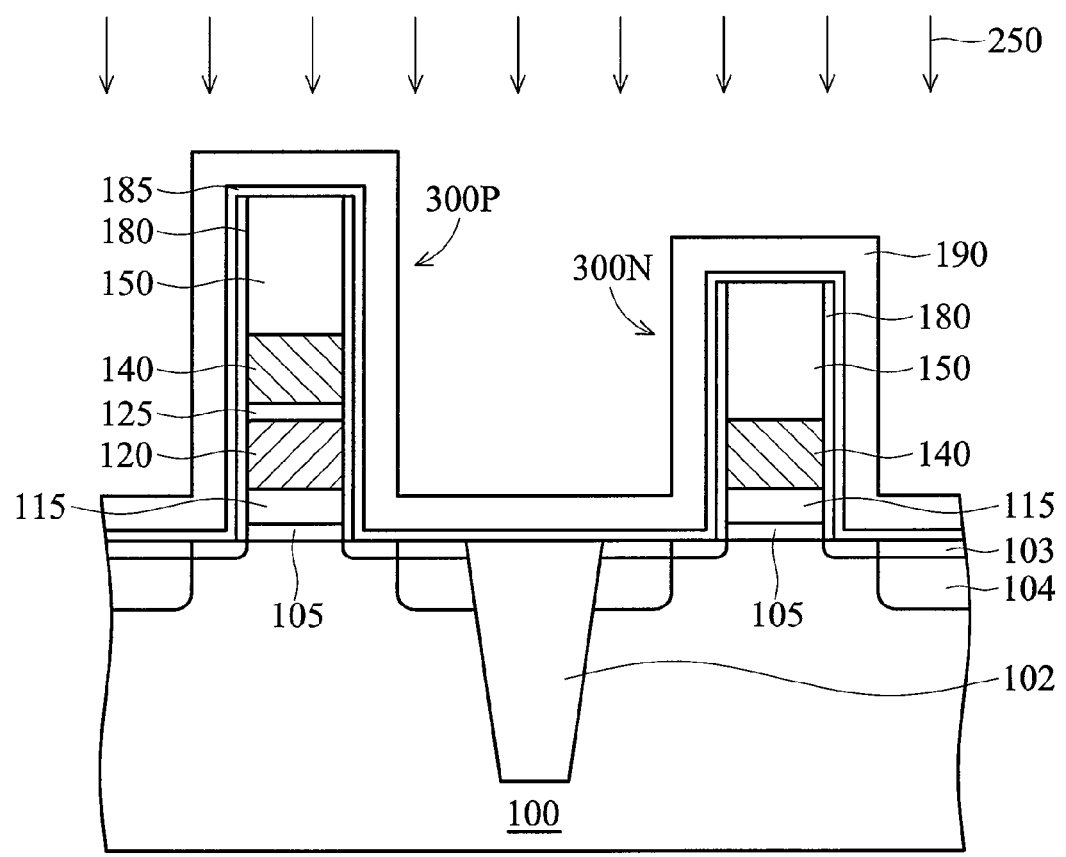
Figure 2I:
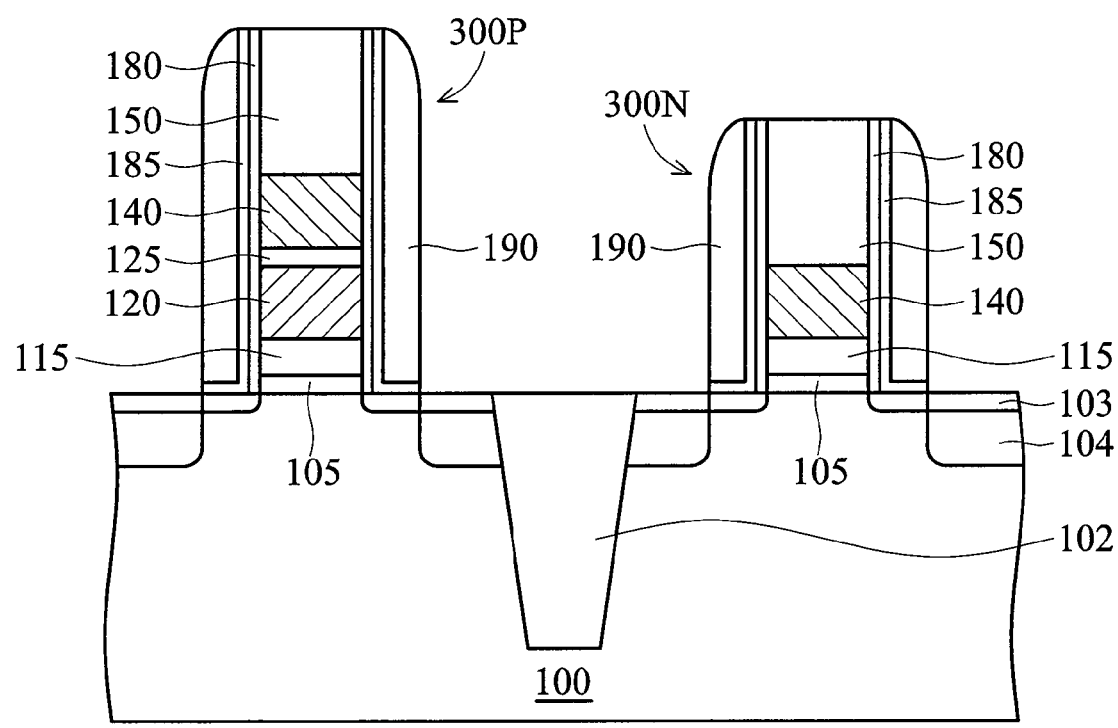

Referring to FIG. 2G, a sealing layer 180 is conformably formed on the substrate 100 covering the first and second gate stacks. The sealing layer 180 comprises an organic material or an inorganic material formed by CVD or ALD, having a thickness ranging from 1 to 20 nm. Moreover, the sealing layer 180 preferably comprises silicon carbide or silicon nitride. The sealing layer 180 is then etched by an anisotropic etching process remaining on sidewalls of the first gate stack and the second gate stack.

After the sealing layer is etched remaining on sidewalls of the first gate stack and the second gate stack, the first transistor 300P is fabricated by performing appropriate source/drain implants 104 and sidewall structures 185 and 190. The first transistor 300P and second transistor 300N can also include a lightly doped drain (LDD) 103 prior to forming sidewall structures 185 and 190 and thereafter implanting a heavily doped impurity distribution to form source/drain implants 104 as will be familiar to those in the field of semiconductor processing, generating the structure shown in FIG. 2I.

The invention is advantageous in that low threshold voltage (Vt) is achieved using $MoN_x$ for the first metal layer of the first transistor 300P and TaC for the second metal layer of the second transistor 300N. The transistors show excellent Ion-Ioff performance with well-controlled short channel effect.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a CMOS device with dual-metal gate structures, comprising:
    providing a semiconductor substrate with a first doped region and a second doped region separated by an insulation layer;
    forming an interfacial layer on the semiconductor substrate;
    forming a high-k dielectric layer on the interfacial layer;
    forming a first metal layer on the high-k dielectric layer;
    forming a metal insertion layer on the first metal layer, wherein the first metal layer and the metal insertion layer are separately formed in different chambers sharing the same transfer chamber without breaking the vacuum;
    patterning the metal insertion layer, the first metal layer, the high-k dielectric layer, and the interfacial layer exposing the second doped region of the semiconductor substrate;
    conformably forming a second metal layer on the metal insertion layer and the second doped region of the semiconductor substrate;
    forming a polysilicon layer on the second metal layer;
    patterning a first metal gate stack and a second metal gate stack on the first and the second doped regions of the semiconductor substrate; and
    forming a sealing layer on sidewalls of the first gate stack and the second gate stack.

2. The method according to claim 1, wherein the interfacial layer is formed resulting from wafer cleaning processes, or wherein the interfacial layer is formed by thermal or chemical oxidation.

3. The method according to claim 1, wherein the high-k dielectric layer is formed by atomic layered deposition (ALD), chemical vapor deposition (CVD), or physical vapor deposition (PVD).

4. The method according to claim 3, wherein a silicon atomic ratio and a dielectric constant of the high-k dielectric layer are adjusted during ALD, CVD, and PVD.

5. The method according to claim 3, wherein adjusting an Hf and a Si precursor cycle numbers during a nano-laminated ALD forms the high-k dielectric layer comprising a $HfSiO_x$ with 30-80% silicon atomic ratio and 7-20 dielectric constant.

6. The method according to claim 1, further comprising a nitrification process during or after the formation of the high-k dielectric layer.

7. The method according to claim 6, wherein the high-k dielectric layer is nitrified by thermal or plasma nitrification.

8. The method according to claim 1, wherein the first metal layer and the second metal layer are separately formed by ALD or PVD.

9. The method according to claim 1, wherein the second metal layer is formed after removal of the first metal layer from the second doped region.

10. The method according to claim 1, wherein the first metal gate stack comprises a tri-layer metal structure comprising the first metal layer, the metal insertion layer, and the second metal layer, and wherein the second metal gate stack comprises a mono-layer metal structure comprising the second metal layer.

11. The method according to claim 1, wherein the metal insertion layer is directly formed by ALD or PVD after formation of the first metal layer.

12. The method according to claim 1 wherein the step of patterning a first metal gate stack and a second metal gate stack comprises removal of the first metal layer and the second metal layer by dry etching, wet etching, or combination thereof.

13. The method according to claim 12 wherein the insertion metal layer serves as protection of the first metal layer from patterning the first metal gate stack and the second metal gate stack.

14. The method according to claim 1, wherein the polysilicon layer is formed by chemical vapor deposition.

15. The method according to claim 1, wherein the sealing layer is formed by CVD or ALD.

16. The method according to claim 1, wherein the sealing layer is etched by an anisotropic etching process remaining on sidewalls of the first gate stack and the second gate stack.

* * * * *